United States Patent
Fu

(10) Patent No.: US 9,060,443 B2
(45) Date of Patent: Jun. 16, 2015

(54) MOUNTING APPARATUS FOR BACKPLANE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Li-Ren Fu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 349 days.

(21) Appl. No.: 13/727,523

(22) Filed: Dec. 26, 2012

(65) Prior Publication Data

US 2014/0160700 A1   Jun. 12, 2014

(30) Foreign Application Priority Data

Dec. 7, 2012   (CN) .......................... 2012 1 0521924

(51) Int. Cl.
  *H05K 5/02* (2006.01)
  *H05K 7/14* (2006.01)
(52) U.S. Cl.
  CPC ............ *H05K 7/1487* (2013.01); *H05K 5/0217* (2013.01); *H05K 2201/044* (2013.01)

(58) Field of Classification Search
  CPC . H05K 7/1439; H05K 7/1445; H05K 7/1487; H05K 5/0221; H05K 5/0217; G06F 1/187
  See application file for complete search history.

(56) References Cited

U.S. PATENT DOCUMENTS

| | | | |
|---|---|---|---|
| 2004/0253842 A1* | 12/2004 | Barsun et al. | 439/59 |
| 2005/0083668 A1* | 4/2005 | Chang | 361/801 |
| 2010/0079936 A1* | 4/2010 | Bridges et al. | 361/679.02 |
| 2013/0135815 A1* | 5/2013 | Zhou | 361/679.33 |
| 2014/0140025 A1* | 5/2014 | Han et al. | 361/760 |
| 2014/0166535 A1* | 6/2014 | Yin et al. | 206/722 |
| 2014/0356060 A1* | 12/2014 | Yin et al. | 403/322.1 |
| 2015/0016879 A1* | 1/2015 | Yin et al. | 403/345 |

* cited by examiner

*Primary Examiner* — Lisa Lea Edmonds
*Assistant Examiner* — Keith Depew
(74) *Attorney, Agent, or Firm* — Novak Druce Connolly + Quigg LLP

(57) ABSTRACT

A mounting apparatus is used for mounting a backplane in a chassis. The backplane defines a number of locking slots in opposite sides and a through hole in a middle portion. The mounting apparatus includes a bracket and a locking member pivotably mounted to the chassis. The bracket includes a bottom plate fixed on the bottom wall, and a side plate and a flange extending up from the bottom plate. The bottom plate defines a slide slot. The side plate and the flange each form a number of retaining tabs. A post extends on the locking member and extends through the slide slot and the through hole. The circuit board is set on the bottom plate, with the locking slots aligned with the retaining tabs. The locking member is rotated, the post drives the circuit board to move, until the retaining tabs retain a top surface of the backplane.

17 Claims, 6 Drawing Sheets

MOUNTING APPARATUS FOR BACKPLANE

BACKGROUND

1. Technical Field

The present disclosure relates to an apparatus for mounting a backplane.

2. Description of Related Art

An electronic device, such as a server, is generally equipped with a plurality of hard disk drives (HDD). The HDDs are connected to a backplane for connection to a motherboard. The backplane is usually fixed in the server by a plurality of screws, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
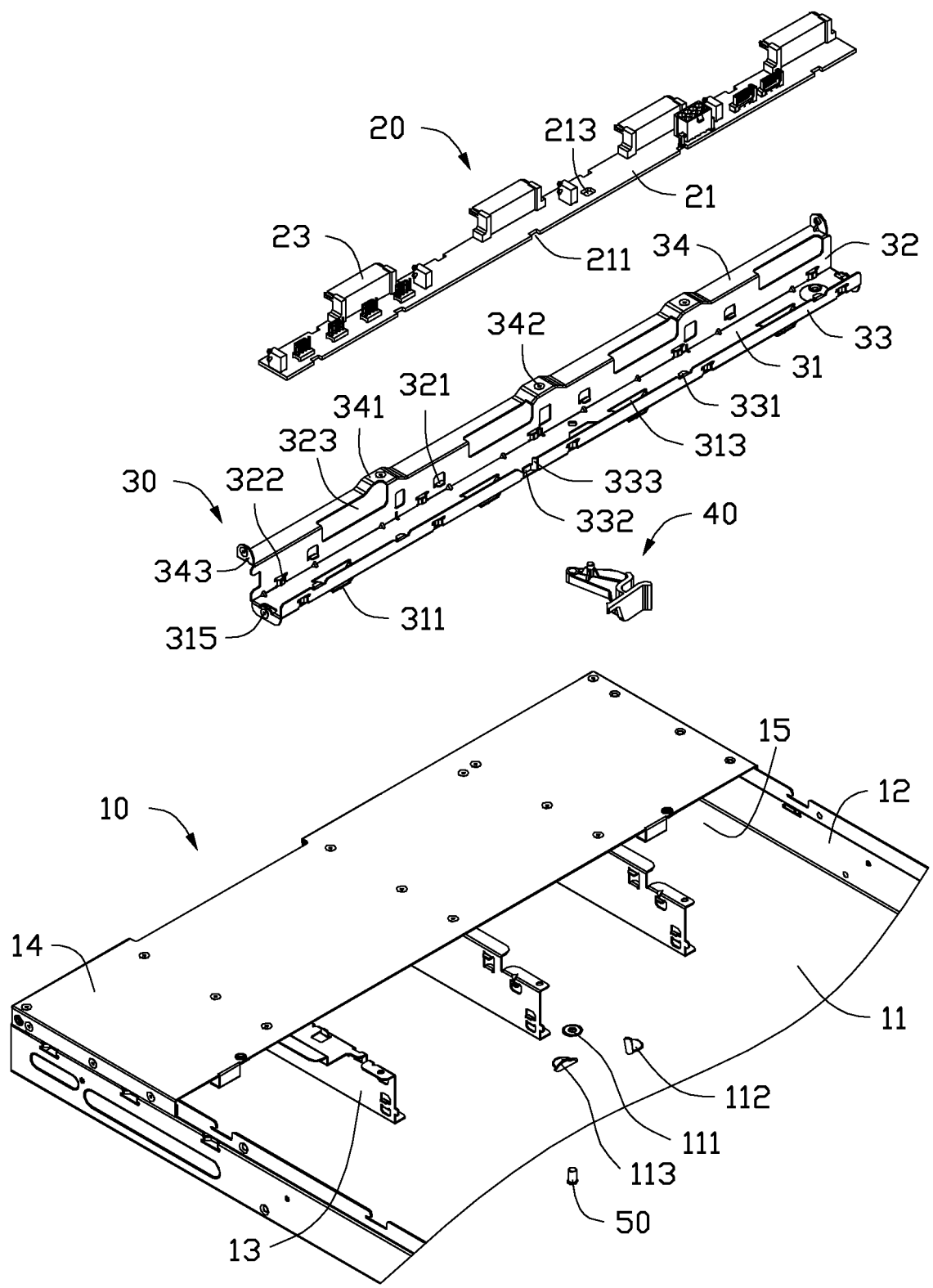
FIG. 1 is an exploded, isometric view of an exemplary embodiment of a mounting apparatus and a backplane, wherein the mounting apparatus includes a locking member.

FIG. 1 shows an exemplary embodiment of a mounting apparatus. The mounting apparatus is provided for mounting a hard disk drive (HDD) backplane 20 in a chassis 10 of an electronic device, such as a server. The backplane 20 is used to connect a plurality of HDDs (not shown). The mounting apparatus includes a bracket 30 for holding the HDDs and a locking member 40.

The chassis 10 includes a bottom wall 11, two sidewalls 12 perpendicularly extending up from opposite sides of the bottom wall 11, a plurality of dividing plates 13 perpendicularly extending up from the bottom wall 11 and between and parallel to the sidewalls 12, and a covering plate 14 above the bottom wall 11 and connected to top portions of the sidewalls 12 and the dividing plates 13. The bottom wall 11, the sidewalls 12, the dividing plates 13 and the covering plate 14 together form a plurality of HDD receiving spaces 15. A pivot hole 111 is defined in a middle portion of the bottom wall 11. A first limiting portion 112 and a second limiting portion 113 extends on the bottom wall 11 and is positioned beside the pivot hole 111.

The backplane 20 is substantially bar-shaped, and includes a circuit board 21 and a plurality of connectors 23 set on the circuit board 21. A plurality of locking slots 211 are defined in opposite sides of the circuit board 21. A through hole 213 is defined in a middle portion of the circuit board 21.

The bracket 30 includes a bar-shaped bottom plate 31, a side plate 32 perpendicularly extending up from a first side of the bottom plate 31, a flange 33 perpendicularly extending up from a second side of the bottom plate 31 and opposite to the side plate 32, and a mounting bar 34 extending from a top of the side plate 32 away from the flange 33. A plurality of bridge-shaped raised portions 311 extend down from a bottom of the bottom plate 31 and are fixed on the bottom wall 11. An elongated slide slot 313 is defined in a middle portion of the bottom plate 31. Two fixing pieces 315 are formed at opposite ends of the bottom plate 31. A plurality of retaining tabs 321 and a plurality of supporting tabs 322 extend toward the flange 33 from the side plate 32. A plurality of openings 323 is defined in the side plate 32 adjacent to the fixing bar 34. A plurality of retaining tabs 331 and a plurality of supporting tabs 332 extend toward the side plate 32 from the flange 33. The flange 33 defines a cutout in a middle portion to form a blocking portion 333 bounding the cutout. A plurality of raised tabs 341 is formed on a top surface of the fixing bar 34. Each raised tab 341 defines a through hole 342. Two fixing pieces 343 are formed at opposite ends of the mounting bar 34.

Figure 2:
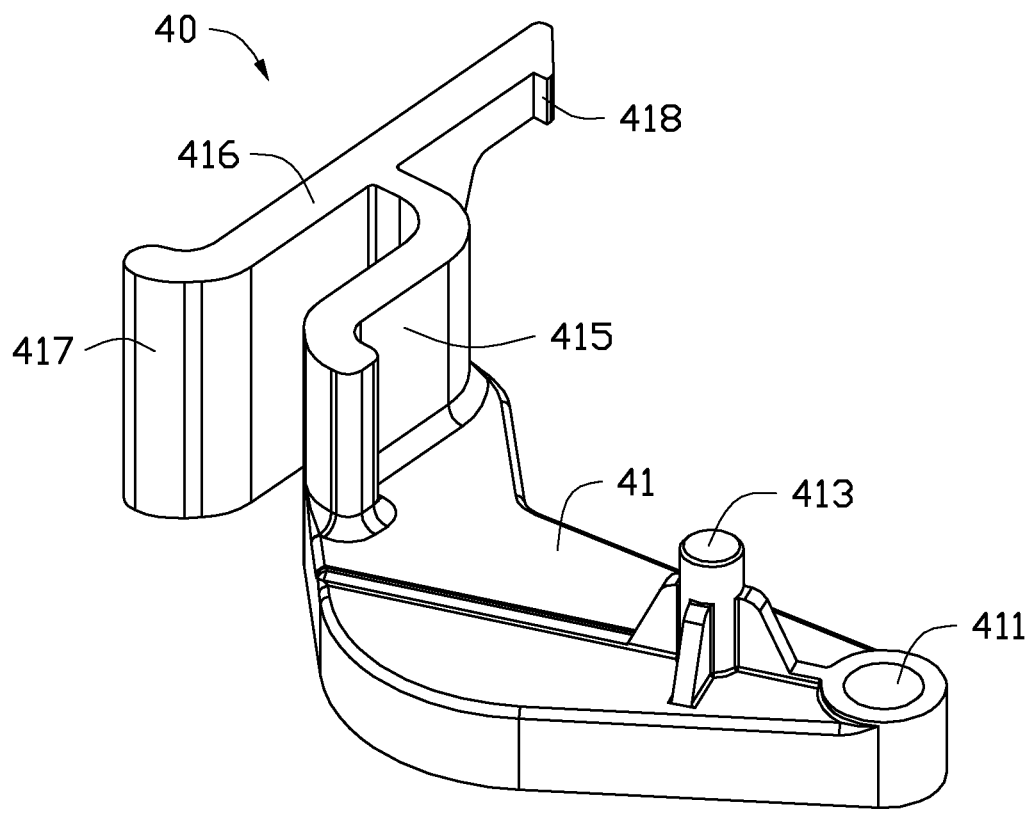
FIG. 2 is enlarged view of the locking member of FIG. 1, but viewed from another aspect.

FIG. 2 shows that the locking member 40 includes a substantially V-shaped main body 41 with a pivot hole 411 defined in a first end of the main body 41 and a post 413 formed on the main body 41 adjacent to the pivot hole 411. A connecting portion 415 is formed at a second end of the main body 41 opposite to the first end. A connecting plate 416 is formed from the connecting portion 415. An operation portion 417 and a hook 418 are formed on opposite ends of the connecting plate 416, respectively at opposite sides of the connecting portion 415.

Figure 3:
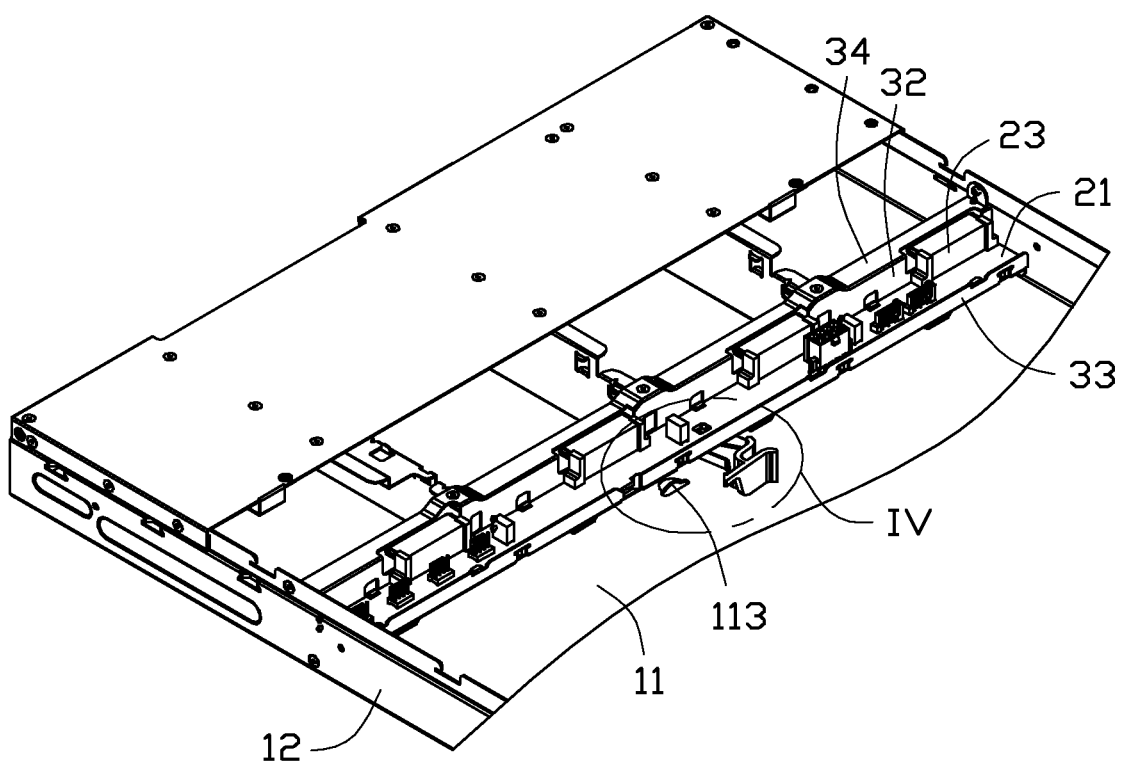
FIG. 3 is an assembled, isometric view of FIG. 1.
Figure 4:
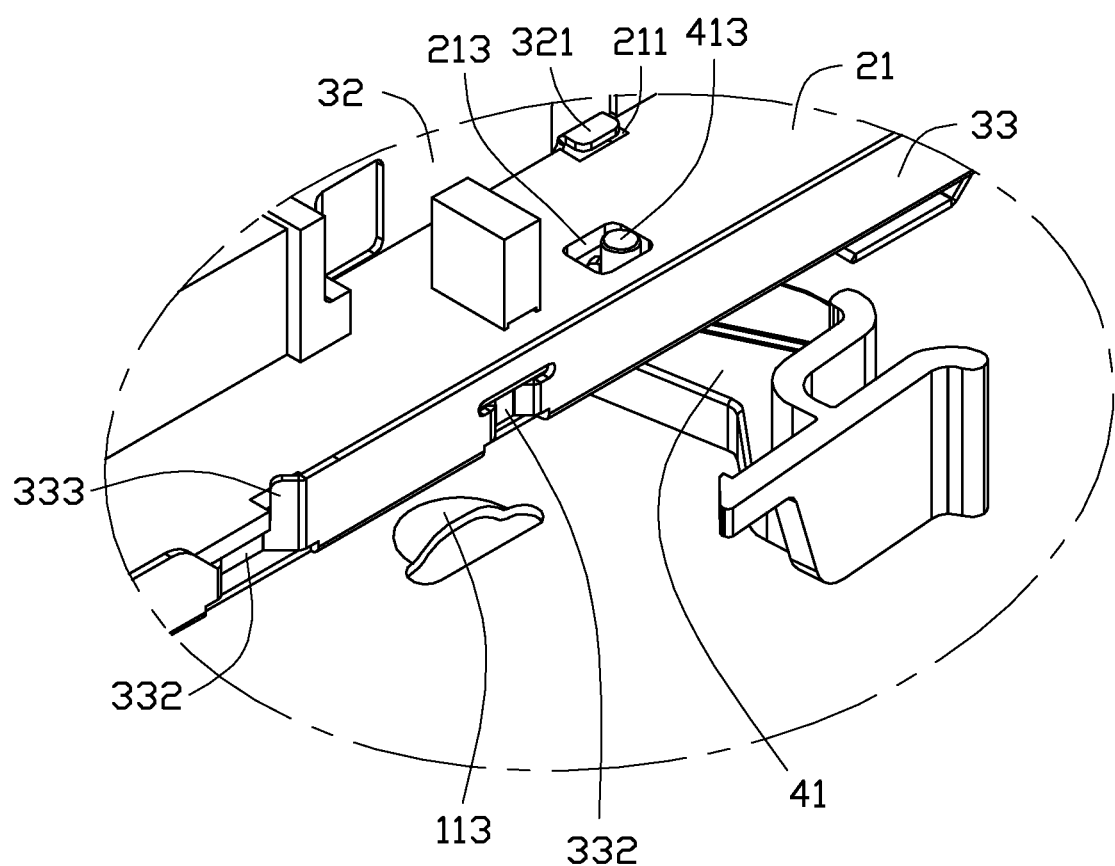
FIG. 4 is an enlarged view of a circle part IV of FIG. 3.

FIG. 3 and FIG. 4 show that in assembly, a shaft 50 (as shown in FIG. 1) extends through the pivot hole 111 and the pivot hole 411 to pivotably connect the locking member 40 to the bottom wall 11. The main body 41 is rotatable about the shaft 50 and limited between the first limiting portion 112 and the second limiting portion 113. The raised portions 311 are fixed on the bottom wall 11, to form a space between the bottom plate 31 and the bottom wall 11, for receiving the locking member 40. The fixing pieces 315 and 343 are fixed on inner surfaces of the sidewalls 12 respectively. The raised tabs 341 are fixed to tops of the dividing plates 13 through screws (not shown) extending through the through holes 342 and engaging in the dividing plates 13, respectively.

When to fix the backplane 20, the circuit board 21 is supported on the supporting tabs 322 and 332, with the locking slots 211 aligned with the retaining tabs 321 and 331, respectively. The post 413 extends through the slide slot 313 to engage in the through hole 213.

Figure 5:
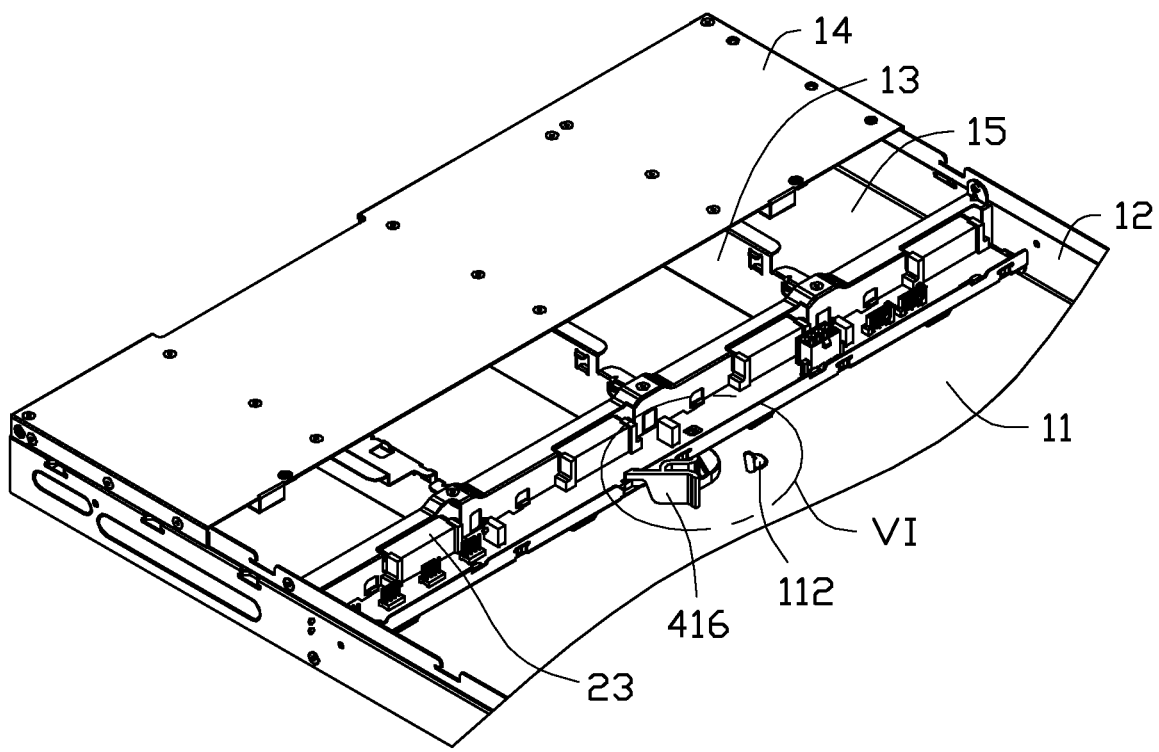
FIG. 5 is similar to FIG. 3, but showing another using state.
Figure 6:
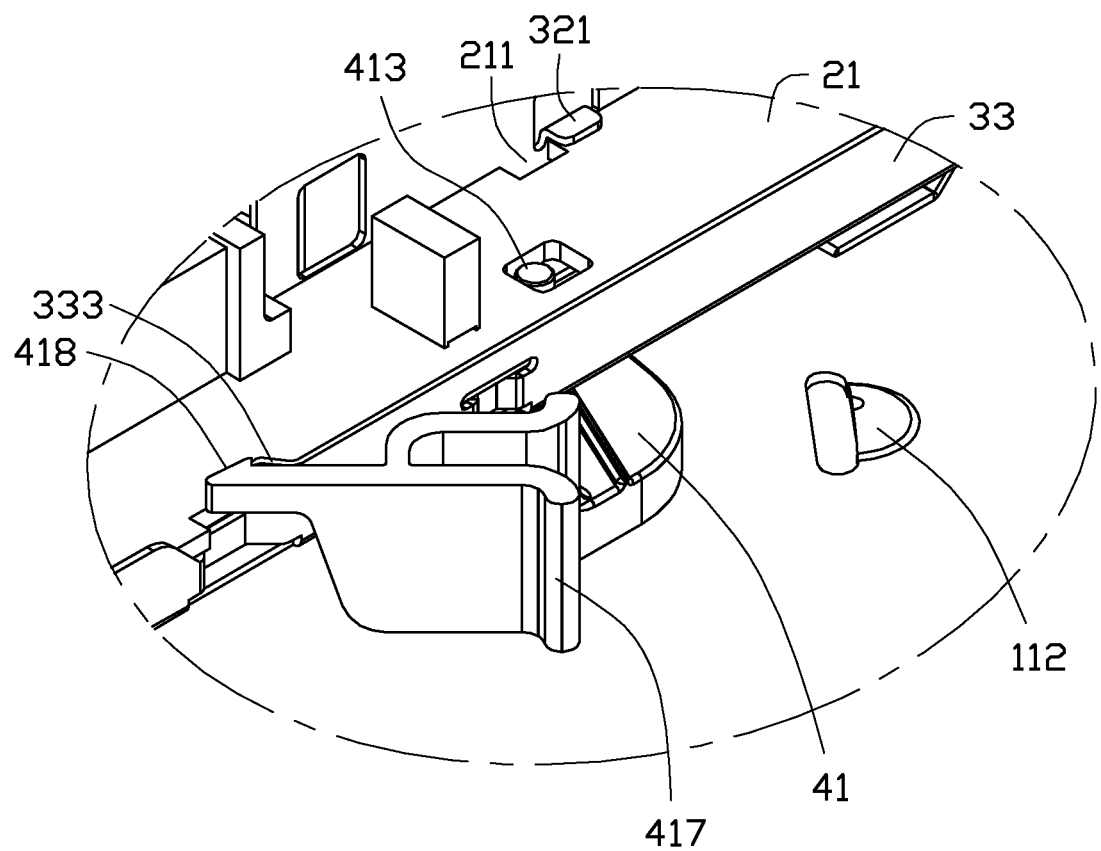
FIG. 6 an enlarged view of a circle part VI of FIG. 5.

FIG. 5 and FIG. 6 show that the operation portion 417 is operated to rotate the locking member 40 toward the second limiting portion 113. The post 413 drives the circuit board 21 to move to one of the sidewalls 12, until the retaining tabs 321 and 331 abut against a top surface of the circuit board 21. Thus, the circuit board 21 is located between the retaining tabs 321 and 331 and the supporting tabs 322 and 332. The connectors 23 align with the openings 323 and the corresponding receiving spaces 15. The hook 418 is locked to the block 333.

When releasing the backplane 20, the operation portion 417 is operated to release the hook 418 from the block 333 and to rotate the locking member 40 toward the first limiting portion 112, until the locking slots 211 align with the retaining tabs 321 and 331, the backplane 20 is then taken up.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A mounting apparatus for mounting a hard disk drive (HDD) backplane in a chassis, the chassis comprising a bottom wall, the HDD backplane comprising a circuit board defining a plurality of locking slots in opposite sides and a through hole in a middle portion, the mounting apparatus comprising:
   an HDD bracket comprising a bottom plate fixed on the bottom wall, a side plate extending up from a first side of the bottom plate, and a flange extending up from a second side of the bottom, wherein the bottom plate defines a slide slot, the side plate and the flange each form a plurality of retaining tabs; and
   a locking member, wherein a first end of the locking member is pivotably connected to the bottom wall, a post extends on the locking member adjacent to the first end, the post extends through the slide slot of the bottom plate and the through hole of the circuit board;
   wherein the circuit board is set on the bottom plate, with the locking slots are aligned with the retaining tabs of the side plate and the flange respectively, the locking member is rotated, the post drives the circuit board to move along the bottom plate, until the retaining tabs of the side plate and the flange abut against top surface of the circuit board.

2. The mounting apparatus of claim 1, wherein the side plate and the flange each form a plurality of supporting tabs adjacent to the corresponding retaining tabs and below the retaining tabs, the circuit board is located between the retaining tabs and the supporting tabs.

3. The mounting apparatus of claim 1, wherein a plurality of raised portions extends down from the bottom plate, the raised portions are fixed on the bottom wall, to form a space between the bottom plate and the bottom wall, for receiving the locking member.

4. The mounting apparatus of claim 1, wherein a block is formed on the flange adjacent to the through hole of the bottom plate, a hook is formed from a second end of the locking member, the hook is locked to the block.

5. The mounting apparatus of claim 4, wherein the locking member comprises a substantially V-shaped main body, a first end of the main body is pivotably connected to the bottom wall, a connecting portion is formed at a second end of the main body opposite to the first end, a connecting plate is formed from the connecting portion, an operation portion and the hook are formed at opposite ends of the connecting plate respectively.

6. An electronic device, comprising:
   a chassis comprising a bottom wall;
   a hard disk drive (HDD) backplane comprising a circuit board defining a plurality of locking slots in opposite sides and a through hole in a middle portion;
   an HDD bracket comprising bottom plate fixed on the bottom wall, a side plate extending up from a first side of the bottom plate, and a flange extending up from a second side of the bottom, wherein the bottom plate defines a slide slot, the side plate and the flange each form a plurality of retaining tabs; and
   a locking member, wherein a first end of the locking member is pivotably connected to the bottom wall, a post extends on the locking member adjacent to the first end, the post extends through the slide slot of the bottom plate and the through hole of the circuit board;
   wherein the circuit board is set on the bottom plate, with the locking slots aligned with the retaining tabs of the side plate and the flange respectively, the locking member is rotated, the post drives the circuit board to move along the bottom plate, until the retaining tabs of the side plate and the flange abut against top surface of the circuit board.

7. The electronic device of claim 6, wherein the side plate and the flange each form a plurality of supporting tabs adjacent to the corresponding retaining tabs and below the retaining tabs, the circuit board is located between the retaining tabs and the supporting tabs.

8. The electronic device of claim 6, wherein a plurality of raised portions extends down from the bottom plate, the plurality of raised portions are fixed on the bottom wall, to form a space between the bottom plate and the bottom wall, for receiving the locking member.

9. The electronic device of claim 6, wherein a block is formed on the flange adjacent to the through hole of the bottom plate, a hook is formed from a second end of the locking member, the hook is locked to the block.

10. The electronic device of claim 9, wherein the locking member comprises a substantially V-shaped main body, a first end of the main body is pivotably connected to the bottom wall, a connecting portion is formed at a second end of the main body opposite to the first end, a connecting plate is formed from the connecting portion, an operation portion and the hook are formed at opposite ends of the connecting plate respectively.

11. The electronic device of claim 6, wherein two sidewalls perpendicularly extend up from opposite sides of the bottom wall, a plurality of dividing plates perpendicularly extend up from the bottom wall and between and parallel to the sidewalls, and a covering plate above the bottom wall and connected to top portions of the sidewalls and the dividing plates, the bottom wall, the sidewalls, the dividing plates and the covering plate together form a plurality of HDD receiving spaces.

12. The electronic device of claim 11, wherein a pivot hole is defined in a middle portion of the bottom wall, a pivot hole is defined in the first end of the locking member, a shaft extends through the pivot hole of the locking member and the pivot hole of the bottom wall to pivotably connect the locking member to the bottom wall.

13. The electronic device of claim 12, wherein a first limiting portion and a second limiting portion extend on the bottom wall and located beside the pivot hole of the bottom wall, a second end of the locking member is limited between the first and second limiting portions.

14. The electronic device of claim 11, wherein the HDD bracket is positioned between the sidewalls, a mounting bar extends from a top of the side plate, the mounting bar is fixed to the top portions of the dividing plates.

15. The electronic device of claim 11, wherein the side plate and the flange each form two fixing pieces at opposite ends, the fixing pieces are fixed to the sidewalls respectively.

16. The electronic device of claim 11, wherein a plurality of openings is defined in the side plate adjacent to and align with the HDD receiving spaces respectively.

17. The electronic device of claim 16, wherein a plurality of connectors is arranged on the circuit board, and aligns with the HDD receiving spaces through the corresponding openings, respectively.

* * * * *